(12) United States Patent
Mallikarjunaswamy et al.

(10) Patent No.: US 10,008,598 B2
(45) Date of Patent: *Jun. 26, 2018

(54) TOP DRAIN LDMOS

(71) Applicant: Alpha and Omega Semiconductor Incorporated, Sunnyvale, CA (US)

(72) Inventors: Shekar Mallikarjunaswamy, San Jose, CA (US); John Chen, Palo Alto, CA (US); Yongzhong Hu, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 14/852,521

(22) Filed: Sep. 12, 2015

(65) Prior Publication Data
US 2017/0141225 A1    May 18, 2017

Related U.S. Application Data

(60) Division of application No. 13/436,308, filed on Mar. 30, 2012, now Pat. No. 9,159,828, which is a
(Continued)

(51) Int. Cl.
*H01L 29/417* (2006.01)
*H01L 29/78* (2006.01)
(Continued)

(52) U.S. Cl.
CPC ...... *H01L 29/7835* (2013.01); *H01L 29/0692* (2013.01); *H01L 29/161* (2013.01);
(Continued)

(58) Field of Classification Search
CPC ..... H01L 2225/06541; H01L 21/76898; H01L 29/7816; H01L 29/0856; H01L 29/0873;
(Continued)

(56) References Cited

U.S. PATENT DOCUMENTS 9,159,828 B2 * 10/2015 Mallikarjunaswamy   H01L 29/4175
2005/0221563 A1 * 10/2005 Baiocchi ........... H01L 29/66659
                                                            438/268
(Continued)

*Primary Examiner* — Davienne Monbleau
*Assistant Examiner* — Leslie Pilar Cruz
(74) *Attorney, Agent, or Firm* — Bo-In Lin

(57) ABSTRACT

In an embodiment, this invention discloses a top-drain lateral diffusion metal oxide field effect semiconductor (TD-LDMOS) device supported on a semiconductor substrate. The TD-LDMOS includes a source electrode disposed on a bottom surface of the semiconductor substrate. The TD-LDMOS further includes a source region and a drain region disposed on two opposite sides of a planar gate disposed on a top surface of the semiconductor substrate wherein the source region is encompassed in a body region constituting a drift region as a lateral current channel between the source region and drain region under the planar gate. The TD-LDMOS further includes at least a trench filled with a conductive material and extending vertically from the body region near the top surface downwardly to electrically contact the source electrode disposed on the bottom surface of the semiconductor substrate.

15 Claims, 9 Drawing Sheets

Related U.S. Application Data continuation-in-part of application No. 13/095,539, filed on Apr. 27, 2011, now Pat. No. 8,816,476.

(51) Int. Cl.
  *H01L 29/06* (2006.01)
  *H01L 29/66* (2006.01)
  *H01L 29/161* (2006.01)

(52) U.S. Cl.
  CPC .... *H01L 29/4175* (2013.01); *H01L 29/41766* (2013.01); *H01L 29/66681* (2013.01)

(58) Field of Classification Search
  CPC ........... H01L 29/0843; H01L 29/66681; H01L 21/823814; H01L 29/4175; H01L 29/41758; H01L 29/41766; H01L 29/0634; H01L 29/7835; H01L 21/75898; H01L 29/4238; H01L 21/743; H01L 29/42376
  See application file for complete search history.

(56) References Cited

U.S. PATENT DOCUMENTS

| | | | |
|---|---|---|---|
| 2005/0280101 A1 | 12/2005 | Babcock et al. | |
| 2006/0030142 A1* | 2/2006 | Grebs | H01L 29/0653 438/618 |
| 2006/0038224 A1* | 2/2006 | Shibib | H01L 29/407 257/335 |
| 2006/0231904 A1* | 10/2006 | Kocon | H01L 21/823487 257/391 |
| 2006/0270215 A1* | 11/2006 | Lee | H01L 21/28525 438/637 |
| 2007/0020863 A1* | 1/2007 | Ma | H01L 23/481 438/297 |
| 2007/0034942 A1* | 2/2007 | Xu | H01L 29/1083 257/329 |
| 2010/0315159 A1* | 12/2010 | Kocon | H01L 27/088 327/564 |

* cited by examiner

Whole-cell pitch

TOP DRAIN LDMOS

This Patent Application is a Divisional Application of application Ser. No. 13/436,308 filed on Mar. 10, 2012 by a common Inventor of this Application and application Ser. No. 13/436,308 is a Continuation in Part Application of application Ser. No. 13/095,539, issued into U.S. Pat. No. 8,816,476 on Aug. 26, 2014, filed on Apr. 27, 2011 by a common Inventor of this Application. The Disclosures made in the patent application Ser. Nos. 13/436,308 and 13/095,539 are hereby incorporated by reference.

BACKGROUND OF THE INVENTION

1. Field of the Invention

The invention relates generally to the semiconductor power devices. More particularly, this invention relates to an inverted grounded source lateral diffusion metal oxide semiconductor field effect transistor (LDMOSFET) structure and manufacturing method.

2. Description of the Prior Art

Conventional technologies to further reduce the source inductance for semiconductor power devices including the source inductance in FET, MOSFET and JFET devices are challenged by several technical difficulties and limitations. Specifically, there are technical challenges faced by those of ordinary skill in the art to reduce the source inductance. Meanwhile, there are ever increasing demand to reduce the source inductance in the semiconductor power devices because more and more power devices are required for applications that demand these devices to function with high efficiency, high gain, and high frequency. Generally, reduction of source inductance can be achieved by eliminating the bond-wires in the package of a semiconductor power device. Many attempts are made to eliminate the bond-wires by configuring the semiconductor substrate as a source electrode for connection of the semiconductor power devices. There are difficulties in such approaches due to the facts that typical vertical semiconductor power devices is arranged to place the drain electrode on the substrate. The vertical power devices, either as trenched gate or planar gate DMOS devices, use the substrate as the drain electrode with the current flowing vertically from the source region disposed at the top of the substrate down to the drain region disposed at the bottom of the substrate and the top source electrode usually requires bond wires for electrical connections during a device packaging process thus increasing the source inductance.

Several lateral DMOS with bottom source have been disclosed as prior art. A lateral DMOS device typically includes a deep P+ sinker region (an implant sinker or a trench sinker) within the source contact to connect the top source to the P+ substrate resulting in a large cell pitch due to the dimensions occupied by the sinker region, or on the outside of the cell resulting in higher source resistance. G. Cao et al. in "Comparative Study of Drift Region Designs in RF LDMOSFETs", IEEE Electron Devices, August 2004, pp 1296-1303, disclose a bottom source lateral LDMOS device, as shown in FIG. 1A, includes a deep sinker diffused within the source contact.

Ishiwaka O et al. disclose in "A 2.45 GHz power Ld-MOFSET with reduced source inductance by V-groove connections", International Electron Devices Meeting-Technical Digest, Washington, D.C., USA, 1-4 Dec. 1985, pp. 166-169, discloses a lateral double-diffused MOS field effect transistor (LD-MOSFET) with V-grooved source connections employed to minimize the source inductance, the gate-to-drain capacitance and the channel length. The V-grooves, which penetrate the $P^-$ type epitaxial layer and reach the $P^+$ type substrate, are formed in the SiO2 region just outside the active area. The $N^+$ type source regions of the LD-MOSFET are directly connected to the V-grooves with metallization, thus eliminate the bonding wires for the source.

In U.S. Pat. No. 6,372,557 (Leong, Apr. 16, 2002), which discloses a bottom source lateral LDMOS device, attempts are made to use a buried layer at the interface of the P+ and P-epitaxial layers to reduce the lateral diffusion and hence reduce cell pitch. U.S. Pat. No. 5,821,144 (D'Anna et al., Oct. 13, 1998) and U.S. Pat. No. 5,869,875 (Hebert, Feb. 9, 1999) also disclose lateral DMOS devices that include a deep sinker region (an implant sinker or a trench sinker) on the OUTER periphery of the structure to reduce the cell pitch.

However, in these disclosures, the devices use a single metal over the source/body contact regions and gate shield regions, which is thick (3 um or more) then due to its thickness it will have higher capacitance from the source metal to N-drift drain, more stress on the gate and also larger spacing to drain metal, thus increases the cell pitch. In the other hand, some of the devices use a first metal for the source/body contact regions and a second metal for drain and gate shield regions, then the first metal is thinner so it can wrap around the gate and shield it with lower capacitance and less stress and does not affect the cell pitch. However, using two metals adds cost since it needs two extra masks—one for via and the other for top metal. These configurations generally form the P+ sinker through top down diffusion resulting in large cell pitch due to the significant lateral diffusions of the deep sinker used to connect the top source down to the highly doped substrate, which increases the overall size of the cell over the horizontal plane. A large cell pitch causes a large on-resistance that is a function of resistance and device areas. A large cell pitch also increases the device costs due to a larger size of the device and a larger size package. Furthermore, reducing the cell pitch of these prior art bottom-source devices results in shifts in the electrical performance of the device. For example, bringing the diffused sinker (which is p+ in doping) closer to the source side of the gate in FIG. 1A will result in a higher threshold voltage since the lateral diffusion of the diffused p+ sinker used to connect the top source to the bottom substrate will encroach in the channel region under the gate, which is also p-type, increase the doping concentration in the channel and hence, increase the threshold voltage, which is an undesirable result.

U.S. Pat. No. 7,554,154 discloses an improved inverted ground-source FET on highly doped substrate, e.g., highly doped P+ substrate, as shown in FIG. 1B, with a self-aligned body-source contact for a reduced cell pitch. The improved FET includes an integrated body-source short structure, i.e., the P+ sinker, which diffuses at the lower portion under the channel and toward the drain. The P+ sinker extends under surface channel to compensate drain extension doping, thus lower Cgd and reduce the cell pitch. In addition, the dopant concentration of the accumulation region is fine tuned to minimize Cgd*Rdson figure of merit. With this top drain LDMOS structure, a buried gate shield is implemented for body-source contact and to reduce the gate to drain capacitance Cgd and the device cells are arranged in a closed configuration that can further reduce extra space required for termination. However, significant lateral diffusions of the deep P+ sinker used to connect the top source down to the highly doped substrate occupies greater space thus limiting further reduction and shrinking of the cell pitches.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved top-drain lateral diffusion MOS (TD-LDMOS) semiconductor power device implemented with a trench source-body interconnect extending from the top surface through the body region down to the bottom source electrode. The device configuration has a reduced cell pitch for reducing die costs such that the above discussed technical difficulties and limitations can be overcome.

Specifically, it is an aspect of the present invention to provide an improved top-drain lateral diffusion MOS (TD-LDMOS) semiconductor power device implemented with a trench source-body interconnect that has a bottom substrate source connection such that the source inductance can be significantly reduced to achieve high efficiency, high gain and high frequency applications by the power device.

It is another aspect of the present invention to provide an improved top-drain lateral diffusion MOS (TD-LDMOS) semiconductor power device implemented with a trench source-body interconnect extending from the top surface through the body region down to the bottom source electrode with a narrow opening and high aspect ratio such that the cell pitch can be significantly reduced and the mask requirement can be reduced to further reduce the fabrication costs for production of high quality and reliable semiconductor power devices.

It is another aspect of the present invention to provide an improved top-drain lateral diffusion MOS (TD-LDMOS) semiconductor power device implemented with a trench source-body interconnect extending from the top surface through the body region down to the bottom source electrode with the trench filled with SEG P++ or SEG P++ SiGe or metal filling material. The trench is further surrounded with P++ liner implant regions below the trench bottom surface and around the trench sidewalls to further reduce the interconnect resistance between the body and source disposed at the bottom surface.

It is another aspect of the present invention to provide an improved top-drain lateral diffusion MOS (TD-LDMOS) semiconductor power device implemented with a trench source-body interconnect extending from the top surface through the body region down to the bottom source electrode wherein a gate shield Ti/TiN layer and a salicide layer are formed covering an insulation layer above the gate insulation layer and a top surface of a body region such that the gate-to-drain capacitance can be further reduced. Therefore, the device disclosed in this invention is rugged and highly reliable such that the device configuration is much more scalable to compatibly operable with high and low voltage applications.

Briefly in a preferred embodiment this invention discloses a top-drain lateral diffusion metal oxide field effect semiconductor (TD-LDMOS) device supported on a semiconductor substrate. The TD-LDMOS includes a source electrode disposed on a bottom surface of the semiconductor substrate. The TD-LDMOS further includes a source and a drain region disposed on two opposite sides of a planar gate disposed on a top surface of the semiconductor substrate wherein the source region is encompassed in a body region constituting a drift region as a lateral current channel between the source region and drain region under the planar gate. The TD-LDMOS further includes at least a trench filled with a conductive material and extending vertically from the body region near the top surface downwardly to electrically contact the source electrode disposed on the bottom surface of the semiconductor substrate.

Furthermore, this invention discloses a method for manufacturing a semiconductor power device on a semiconductor substrate. The method includes a step of 1) forming a body region encompassing a source region and a drain region with a gate on a top surface of the semiconductor substrate for controlling a lateral current path in the body region between the source region and a drain region near the top surface of the substrate; and 2) opening a trench extending from the body region downwardly to a source electrode on a bottom surface of the substrate and filling the trench with a conductive material to function as a body-source interconnect. In an embodiment, the step of filling the trench with a conductive material comprises a step of filling the trench with the conductive material comprising a selective epitaxial growth (SEG) of silicon or a SEG of silicon-germanium (SiGe). In another embodiment the method further includes a step of implanting a heavily doped liner region below the bottom of the trench and surrounding sidewalls of the trench These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
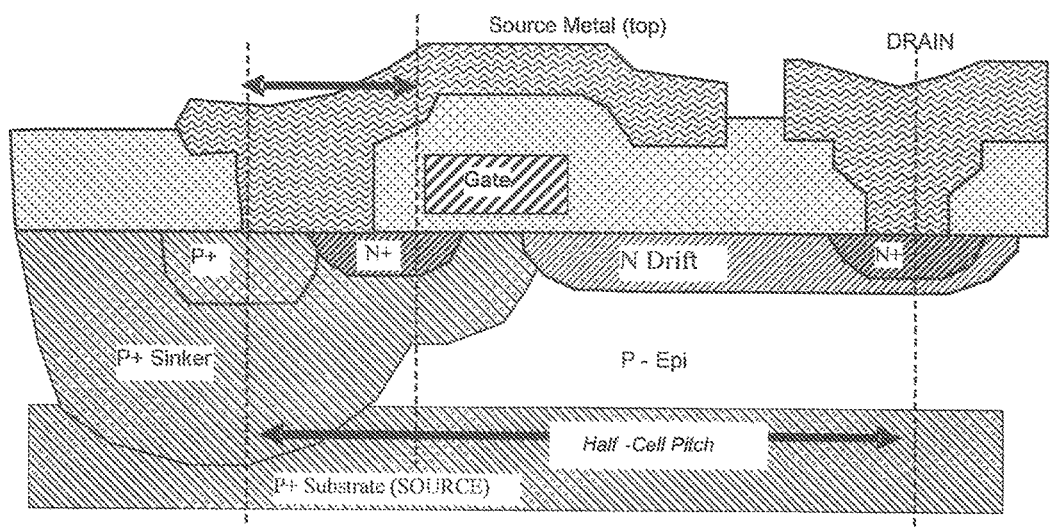
FIG. 1A is a cross sectional view of a conventional lateral diffusion MOS (LDMOS) device with a bottom source used for RF base station amplifier.
Figure 1B:
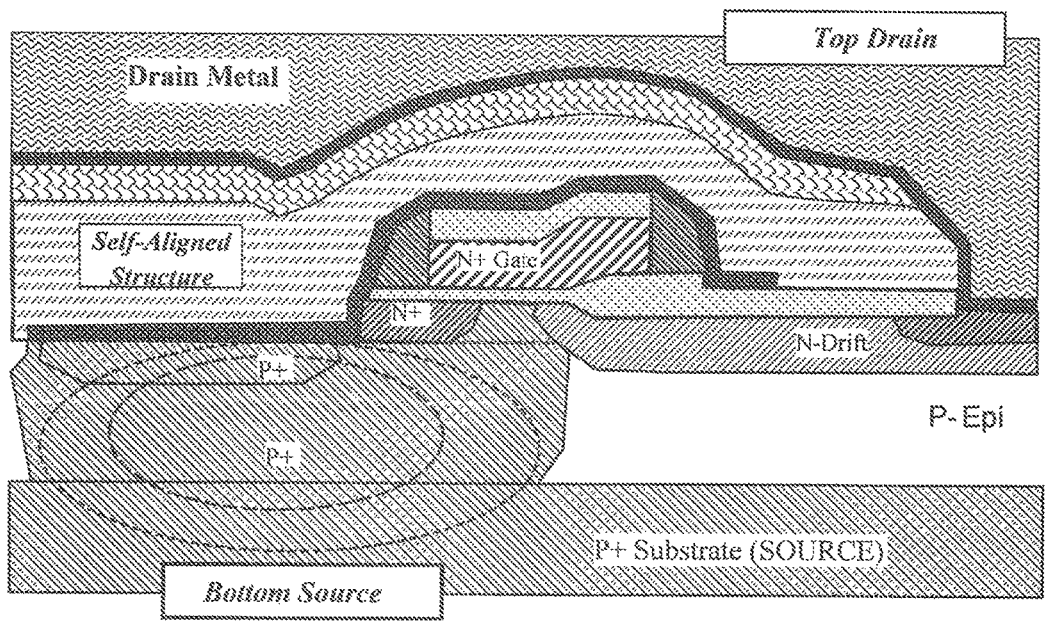
FIG. 1B is a cross sectional view of bottom source LDMOS with diffused sinker region disclosed in a referenced patent.
Figure 2A:
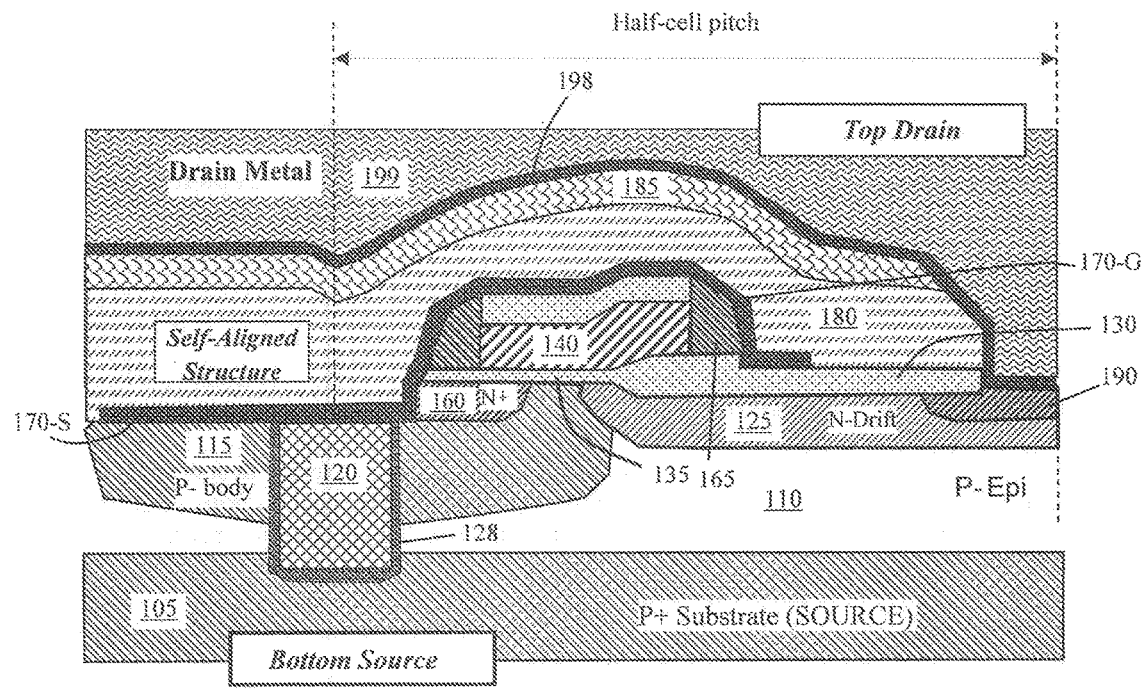
FIG. 2A is a cross sectional view of a top drain LDMOS device with trench body-source short structure as an embodiment of this invention.

Referring to FIG. 2A for a cross sectional view of an N-channel inverted top drain and ground-source trenched FET device with a top drain and a bottom source of this invention. The inverted top-drain ground-source N-channel FET device is supported on a P+ substrate 105 functioning as a bottom source electrode. Alternatively, a P-channel device may be formed over an N+ Si substrate. A layer of P− epitaxial layer 110 is supported on top of the substrate 105. The substrate is configured with an active cell area and a termination area typically disposed on the peripheral of the substrate. A deep trench 120 with a high aspect ratio is opened through the epitaxial layer 110 and extending downwardly to the substrate 105. Selective epitaxial growth (SEG) of silicon or SEG of silicon-germanium (SiGe) with a heavily P doped P++ is performed to fill the deep trench 120 forming a self-aligned source/body contact functioning as an ultra-low resistive local interconnect from source to body and to the substrate. For the purpose of improving the contact, a P++ liner implant region 128 is formed with angled P++ implant below the bottom of the trench and surrounding the sidewalls of the source-body interconnect trench 120 before the P++ conductive trench filling material is filled in the trench. A body region 115 is formed in the upper portion of the epitaxial layer 110 that extends laterally to a drain drift region 125. The P-dopants in the body region 115 compensate some of the N− dopant in the accumulation of the transistor for tailoring a dopant profile of N-drift region 125 to minimize the gate-drain capacitance while maintaining a low drain to source resistance Rdson. The deep trenched source-body interconnect 120 further extends vertically both downward to the bottom P+ substrate 105, and upward to the body region 115. Part of the body region 115 forms a channel at a top surface under a gate oxide 135. The deep trenched source-body interconnect 120 has a narrow opening and high aspect ratio such that the cell pitch can be reduced without requiring a sinker region that is formed with a lateral diffusion expansion for the purpose of extending the sinker region to a greater depth to reach the bottom source region 105.

A stacked planar gate 140 surrounded by a gate spacer 165 and covered by a gate shield metal 170-G is disposed above the gate oxide layer 135 formed on the top surface between the source region 160 and the drain drift region 125. The gate 140 thus controls the current flow between the source region 160 and the drain drift region 125 through the channel form by body region 115 under the gate 140 to function as a lateral MOS device. The drain drift region 125 is disposed below a field oxide 130 covered by a BPSG layer 180 and optionally a passivation layer 185. A drain contact opening is etched through the passivation layer 185 and the BPSG layer 180 for the top drain metal 199 to contact the drain region 125 via a contact N+ dopant region 190 with reduce contact resistance. The stacked gate 140 with the oxide 130 and 135 below the stacked gate 140 as shown may be formed by different methods. The methods include the processes of growing or depositing the oxide and etching from the channel region or by using a LOCOS type of oxidation process. The stacked gate 140 has a longer gate length and field plating over the drain extension without increasing the cell pitch. The stacked gate 140 controls the link for current to flow between the channel and the drain under the gate oxide 135 and field oxide 130 with reduced gate-drain capacitance. The stacked gate 140 is surrounded by insulation spacer 165 and surrounded by a buried gate shield 170-G that further includes a salicide portion 170-S for body-source contact and to further reduce the gate to drain capacitance Cgd with the gate shield layer 170-G shields the drain metal 199 covering over the top surface. For better mechanical and electrical performance, a barrier Ti/TiN liner layer 198 is further formed between the drain contact region 190 and the drain metal 199. The half pitch of the cell is significantly reduced with the self-aligned source-body interconnected formed as trench 120 filled with the selective epitaxial growth (SEG) P++ Si or SEG P++ SiGe such that no sinker diffusion is required.

Figure 2B:
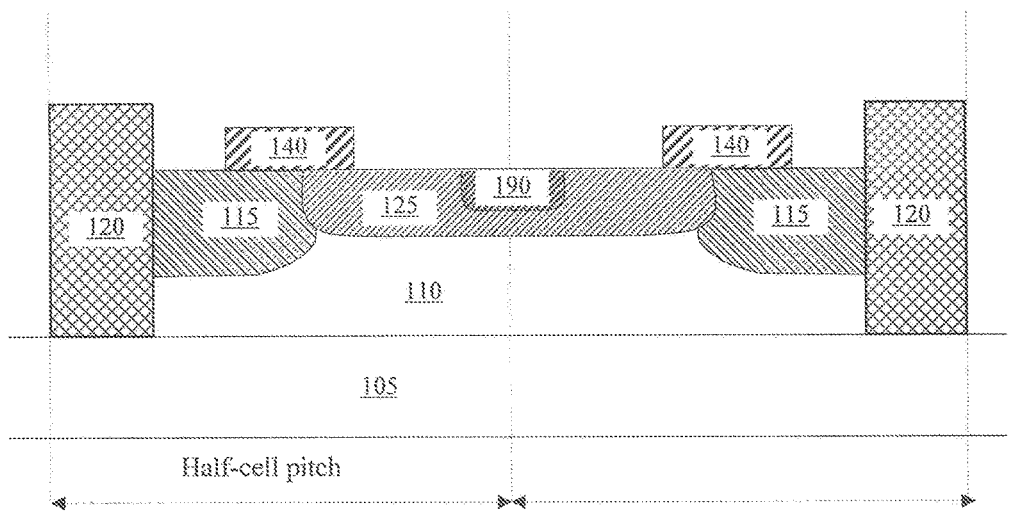
FIG. 2B is a cross sectional view illustrating a whole TD-LDMOS device cell that can be arranged in a closed cell configuration.
Figure 2C:
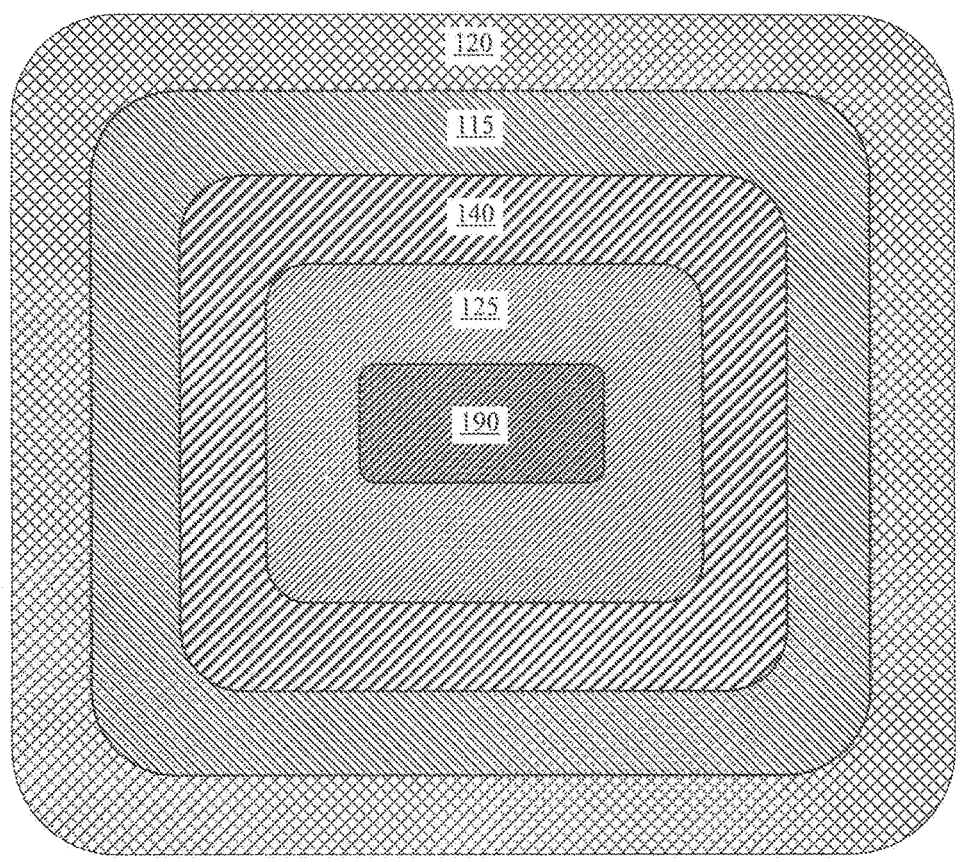
FIG. 2C is a top view illustrating a whole TD-LDMOS device cell that can be arranged in a closed cell configuration.

FIG. 2B is a cross-sectional view illustrating a whole cell of the TD-LDMOS device of this invention, which can be arranged in a closed cell configuration. As shown in FIG. 2B, both sources of the half-cell pitch are grounded, thus space savings are achieved because there is no need to provide the extra space for termination area for this TD-LDMOS device. FIG. 2C is a top view of a whole cell of the TD-LDMOS device of this invention, which can be arranged in a closed cell configuration.

Figure 3:
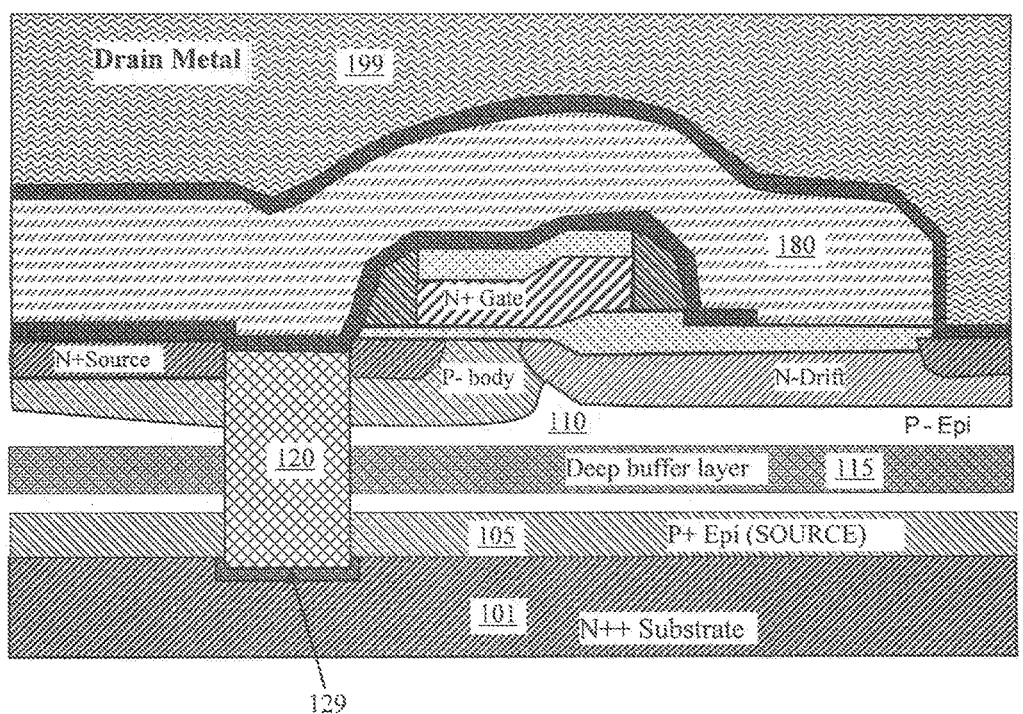
FIG. 3 is a cross sectional view of another top drain LDMOS device as another embodiment of this invention.

FIG. 3 is another exemplary embodiment of the TDLDMOS device that is similar to the device shown in FIG. 2. The only difference is that the device is formed on a heavily doped N++ substrate 101 to substantially reduce the series resistance. The P+ epitaxial layer 105 functioning as a bottom source electrode is formed on top of the N++ substrate 101 and shorted to the N++ substrate, thus reduce the resistance of the substrate. Furthermore, as an optional, a deep buffer layer 115 is formed within the P− epitaxial layer 110 at a predetermined depth and above the P+ source layer 105 for the purpose of breakdown voltage (BV) adjustment and sub-surface punch-through prevention due to thermal cycles as that required in the manufacturing processes. In this embodiment, the deep trench 120 opens through the P-epitaxial layer 110 and the P+ source layer 105 extends downwardly to the N++ substrate 101. As that described above in FIG. 2A, the deep trench 120 has a high aspect ratio and is filled with a heavily P doped P++ conductive material such as selective epitaxial growth (SEG) of silicon or SEG of silicon-germanium (SiGe). Alternatively, the deep trench 120 can be filled with P++ poly or with a metal, such as tungsten, with a metal liner 129, for example salicide Ti/TiN, forming an ultra-low resistive local interconnect between the drain and the source. The passivation layer 185 can be omitted with this device configuration.

Figure 4A:
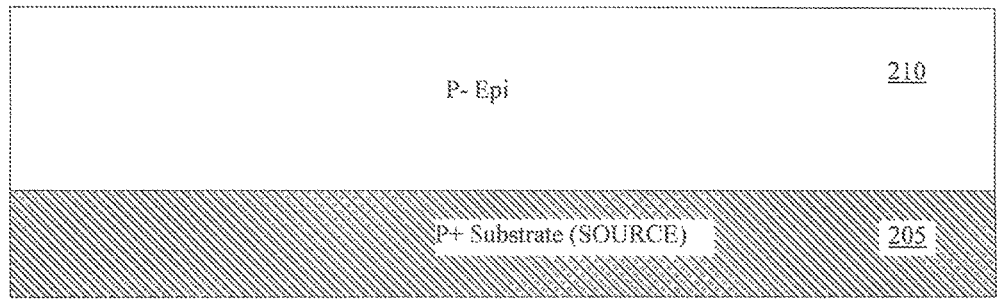
FIGS. 4A to 4L are a serial cross sectional views for describing the manufacturing processes to fabricate a TD-LDMOS device of this invention.

FIGS. 4A to 4L are a series of cross sectional views to illustrate the manufacturing processes for making a device structure as shown in FIGS. 2A and 3. As will be understood from the disclosures made in through the descriptions of the manufacturing steps, the processes only require six masking steps because of a beneficial Self-Aligned Structure. As shown in FIG. 4A, the processes start with a starting silicon substrate that includes a P+ substrate 205 doped with Boron with a resistivity of 3 to 5 mOhm-cm or a lower resistivity. The substrate 205 is preferably along a <100> crystal orientation as a standard prime. A P− epitaxial layer 210 is formed on the substrate 205 with a thickness ranging from 2 to 7 micrometers and typically doped with a low dosage of 5E14 to 5E15 for 20-60 volts application. In another embodiment, the epitaxial layer 210 may be an N− doped layer.

Figure 4B:
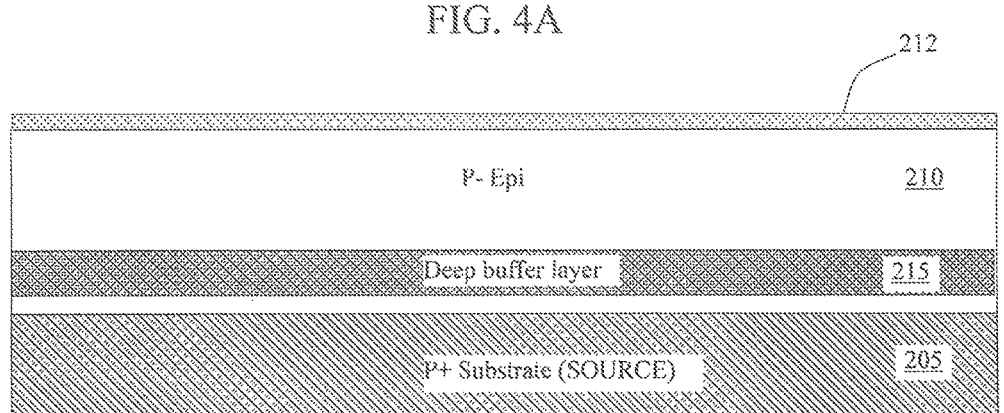

In FIG. 4B, a pad oxide layer 212 is grown for a nitride deposition step later in process. As an optional processing step, a blanket deep buffer layer implant with an implant dose of 1E14 at an implant energy of approximately 600 KEV is performed to form a deep buffer layer 215 for the purpose of breakdown voltage (BV) adjustment and sub-surface punch-through prevention between the N-drift layer, formed in later process, and P+ substrate 205 due to thermal cycles as that required later on when subsequent manufacturing processes are carried out. It can be a lightly doped blanket P implant to increase the P− doping to avoid punch through or it can be a lightly doped N-implant for an N-epi.

Figure 4C:
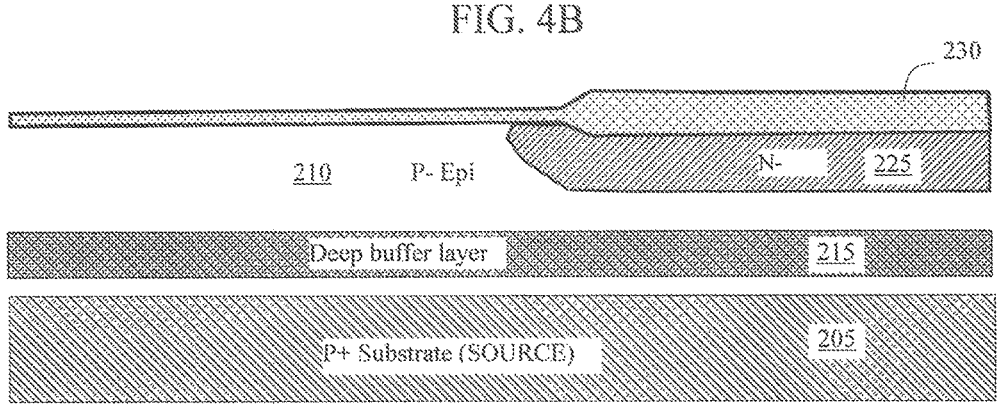

A nitride deposition is carried out on top of the pad oxide layer 212 and then etched using an active mask, first mask, which is not shown, to protect the channel region and expose the drain extension region during the subsequent processing. An N-drift implant is performed in the regions not protected by nitride at a zero degree tilt to form the N-drift region 225 as shown in FIG. 4C. The N-drift region 225 can be formed by implanting Phosphorous with an implanting energy ranging between 60 Kev to 200 Kev and a dosage ranging from 5E11 to 2E13 and preferably a dosage of 3E12 for 30V application. This step results in a self-aligned n-type drift implant (for NMOS) in the drift drain extension of the LDMOS device, region 225. This is followed by a standard field oxidation process (referred to as LOCOS), with optional N2 drive step, to form mold oxide region 230 atop of the N-drift region 225. Temperature can be in the range of 900 to 1100 C to grow an oxide with a thickness in the 0.3 to 1 micron range, with a preferred thickness of about 0.55 microns.

Figure 4D:
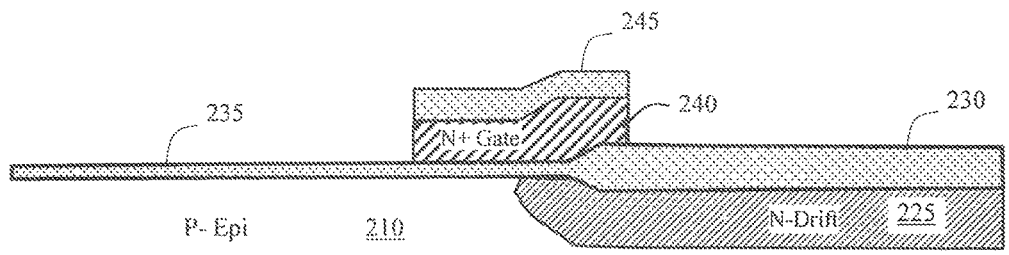

Nitride (not shown) and the pad oxide 212 are stripped followed by a sacrificial oxide layer growth and strip (not shown) to clean the surface of the structure. In FIG. 4D, a gate oxide layer 235 is grown followed by depositing a polysilicon layer or preferably a polycide layer 240 having a thickness up to 2000 to 6000 Angstroms for forming a gate. Then the N+ dopant ions are implanted to the Polysilicon layer and an optional WSix layer is formed on top for providing a low gate resistance contact layer. Note the poly can be in situ doped or doped using $POCl_3$ as well. An oxide cap deposition by using a HTO or LTO process is carried out to deposit an oxide cap layer 245 on top of the polysilicon layer 240. The oxide cap layer 245 has a thickness of about 500 to 4500 Angstroms on top of the polysilicon layer 240. A gate mask, i.e., a second mask (not shown), is applied to etch and pattern the oxide cap layer 245 and the gate layer 240. An oxide etch is first performed to pattern the oxide cap layer 245 followed by a polysilicon or polycide etch. The polysilicon or polycide etch is stopped on top of the gate oxide layer 235 and the field oxide 230 as shown.

Figure 4E:
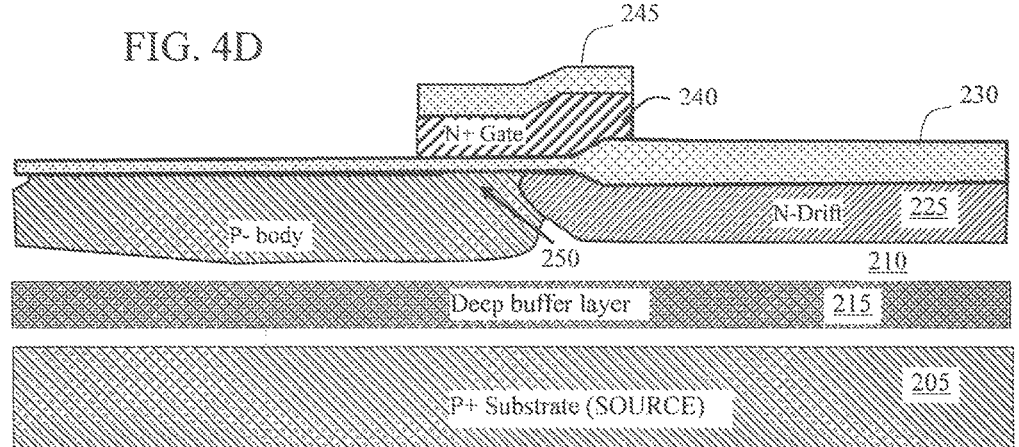
Figure 4F:
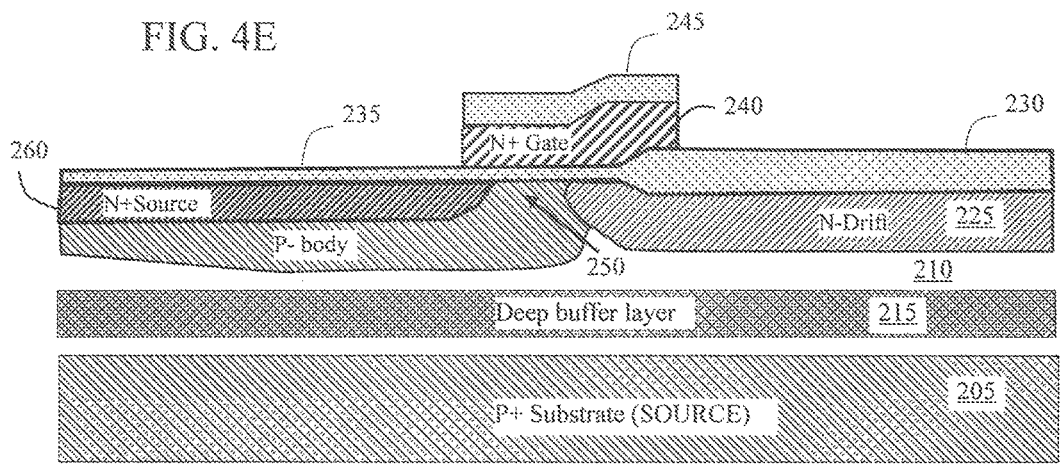

In FIG. 4E, a blanket shallow body high angle implantation of boron (high angle implantation to introduce channel under the gate) with a dosage range between 1E12 to 1E14, preferably at a dose of 1E13, is carried out to form the P-body region 250. Optionally, the blanket shallow body implantation at zero angle and higher energy body implant is also carried out to form P-body region 250. With the field oxide 230, the gate 240 and oxide cap 245 stack-structures, the boron ions are implanted only in the source side of the gate. Then a body drive is performed with an elevated temperature ranging between 950 to 1150 degrees Celsius and preferably at 1050 degree Celsius for approximately 60 minutes. In FIG. 4F, a blanket shallow source-implant, for example As dopant ions implanted with a dosage ranging between 1E15 to 1E16, preferably at 4E15, is carried out to form N+ source region 260. Then a source annealing operation at an elevated temperature ranging between 850 C to 1000 C and preferably 950 C is performed for 30 minutes. Some oxygen may be used during the source anneal annealing process depending on the gate stack to form poly oxide side wall on the edges of the stacked gate 240.

Figure 4G:
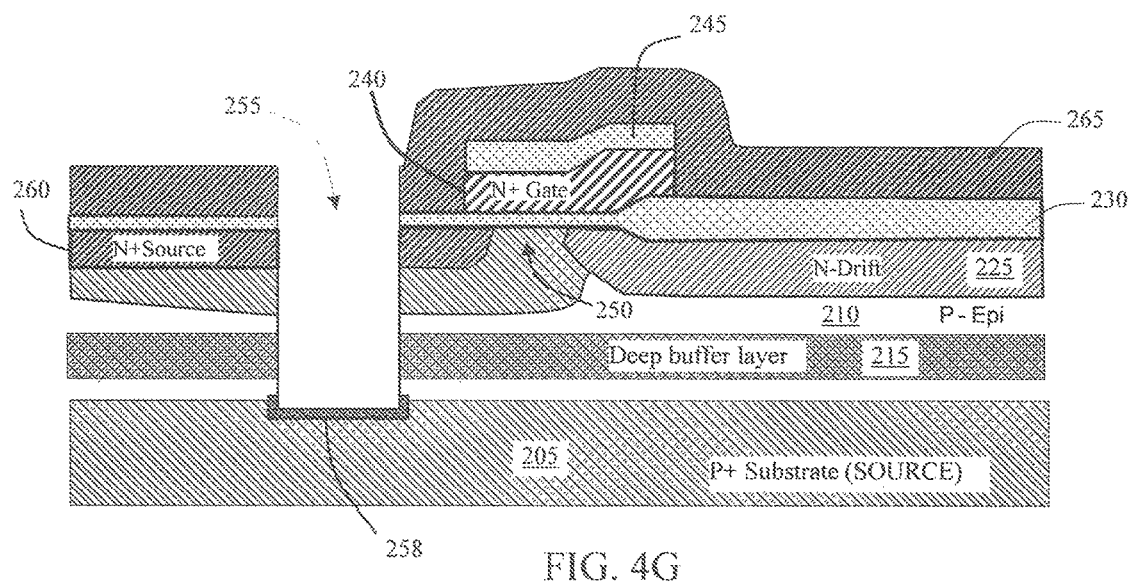
Figure 4H:
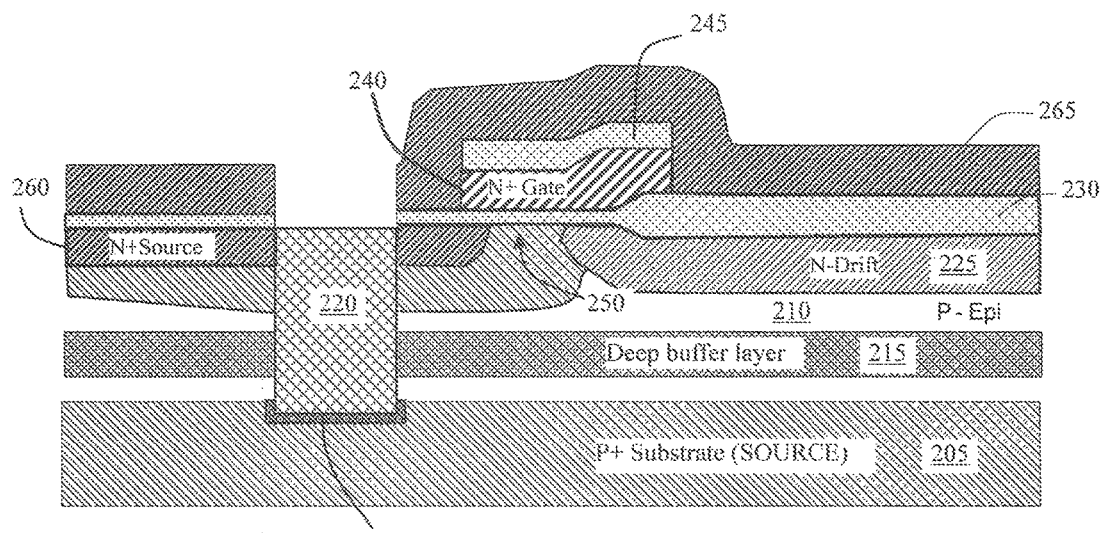
Figure 4I:
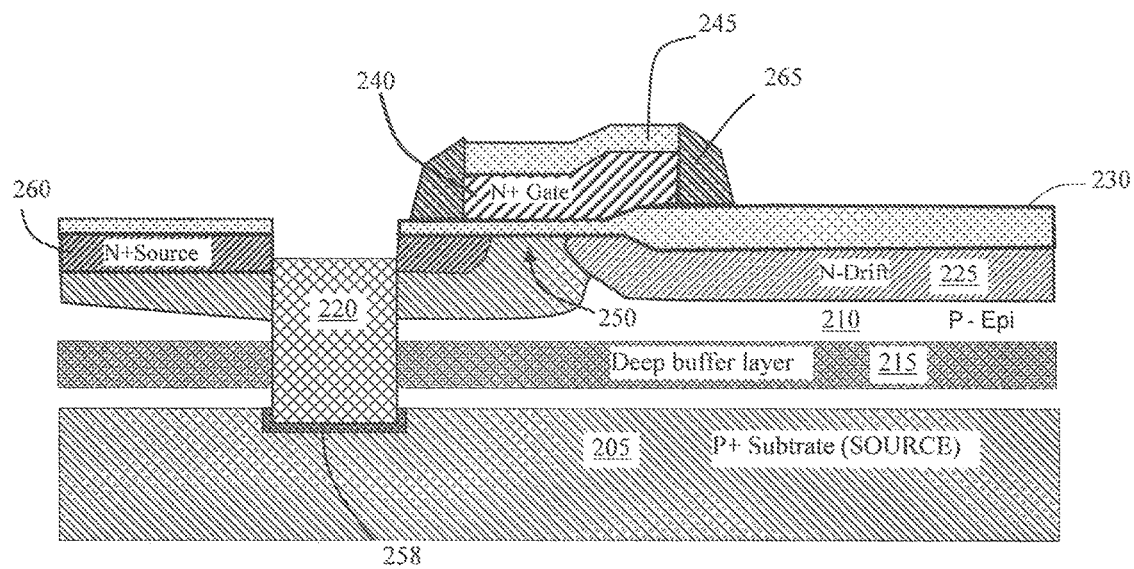

In FIG. 4G, a spacer oxide layer 265 is deposited, which is preferably a conformal oxide layer having a thickness ranging between 1000 to 4000 Angstroms and preferably more than 3000 Angstroms to function as a hard mask for body trench etch and isolation for selective epitaxial growth (SEG) and also to passivate gate sidewall in subsequent manufacturing processes. Then a source-body local interconnect trench mask, i.e., third mask, (not shown), is applied then an oxide etch followed by a silicon etch is performed to open a trench 255 with a narrow opening and high aspect ratio with a trench depth extends downwardly to reach the P+ substrate 205. Then the photoresist (not shown) is removed. A blanket P++ implant at a seven degree tilt implant angle is optionally carried to implant heavily doped P++ into the trench bottom, also to the sidewall of the trench (not shown), to form the liner implant region 258 for better contact. In FIG. 4H, a selective epitaxial growth (SEG) of Si or SiGe with highly doped P++ is performed, preferably a SEG of SiGe doped with P++ boron, to form an ultra-low resistive local interconnect 220 from source 260 to body layer 250 and deep buffer layer 215 and to the substrate 205. In FIG. 4I, an oxide spacer etch is carried out by performing a reactive ion etch (RIE) to form the gate spacer 265 to passivate gate sidewalls with minimal over etch to assure that there is oxide, 230 and 245, left below the polysilicon gate 240 and on the drain extension.

Figure 4J:
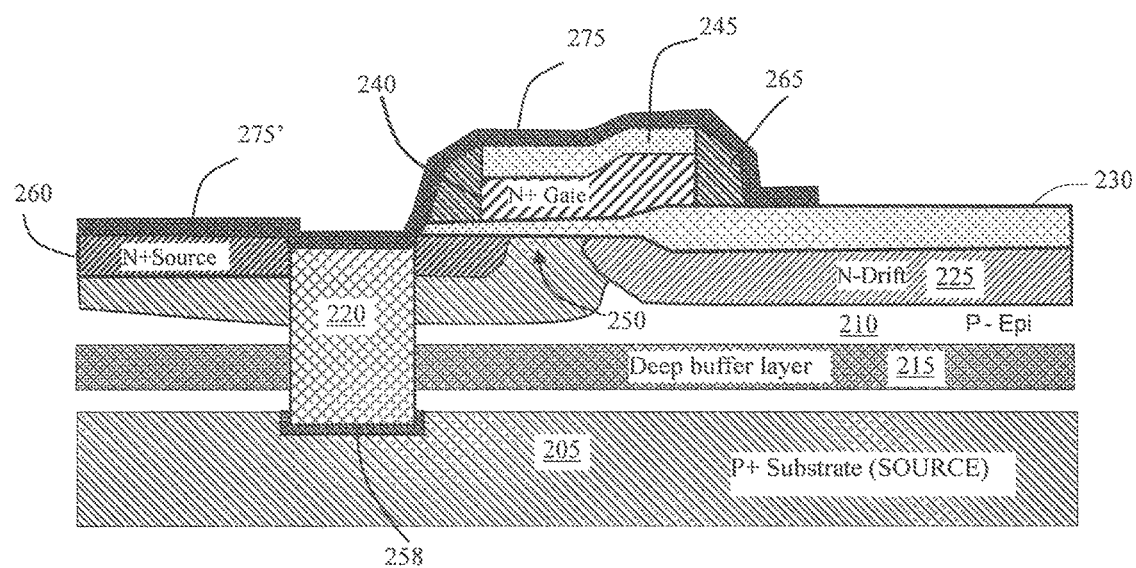

In FIG. 4J, a slight wet oxide etch is performed to remove the oxide on top of the N+ source regions 260. Ti or Co is then deposited on top surface of the silicon to form Ti or Co layer 275'. Then, a first salicide formation process is carried out by applying a first rapid thermal annealing (RTA) process to form TiSi or CoSi layer 275' on the top surface of the silicon and Ti/TiN layer 275 on top of the oxide layers 265, 245 and 230. The process is continued by applying a gate shield mask, i.e., fourth mask (not shown), followed with a Ti/TiN wet etch to form the gate shield 275. This mask is not required if the gate shield is not needed. Then the photoresist is removed followed by carrying out a second salicide formation also carried out with RTA to form TiSi2 or CoSi2 layer 275' on the top surface of the silicon. The silicidation processes form a self-aligned body-source interconnects with good contact and low resistance and a good gate shield metal with good insulation.

Figure 4K:
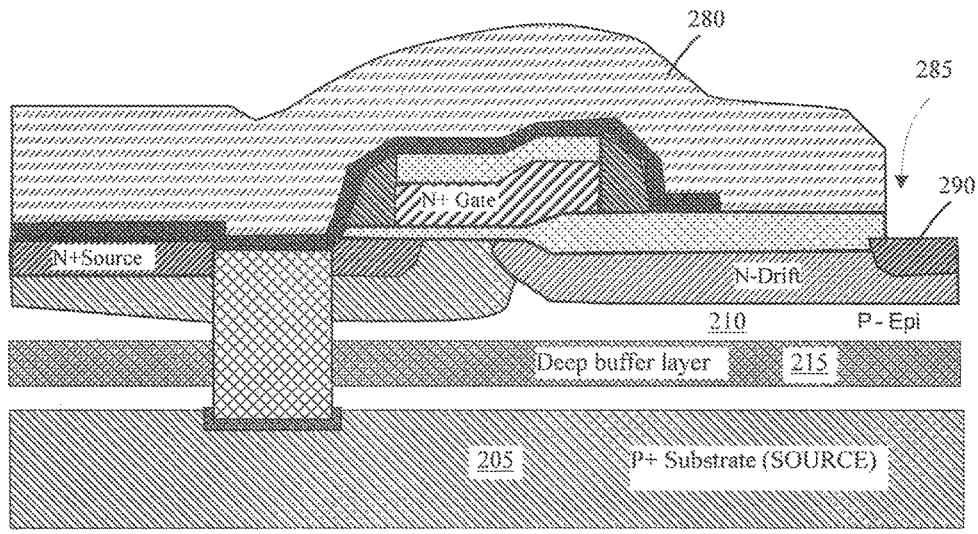
Figure 4L:
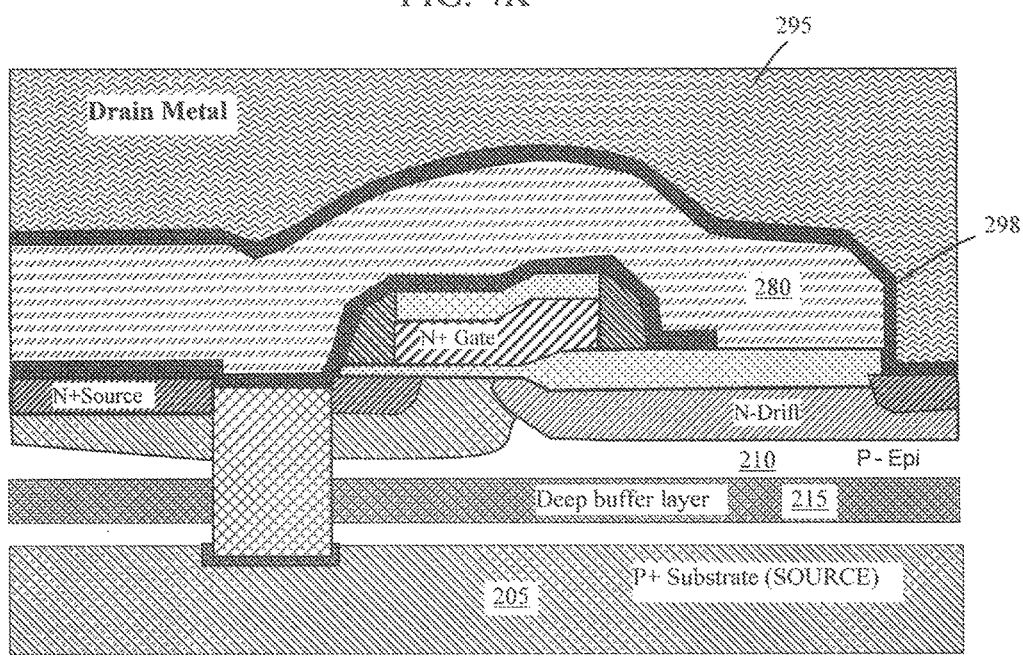

In FIG. 4K, an ILD0 material including oxide, nitride or oxy-nitride is deposited to form the insulation layer 280 followed by applying a drain and gate mask (not shown), i.e., fifth mask, to open the gate contact opening (not shown) and drain contact openings 285 over the insulation layer 280. A low energy contact implant with phosphorus ions with an implant dosage between 5E14 to 1E16 is performed to form the low resistance contact regions 290 followed by an annealing process preferably using RTA with temperature between 700-900 C in N2 and for a time of 20 sec to 5 minutes, preferably 1 minute. In FIG. 4L, a thick metal deposition with Ti/TiN liner is carried out to form the drain metal 295 with barrier metal layer 298. Then a metal mask, i.e., sixth mask (not shown), is applied to perform a metal etch to form the gate metal and the drain metal on the top surface followed by removing the photoresist, cleaning up and an alloy process to complete the manufacturing processes.

In another embodiment, which is not shown, the process start with a heavy doped N++ silicon substrate, then a P+ source epitaxial layer is formed on the N++ substrate followed by a growth of a P– epitaxial layer on the P+ source epitaxial layer. The following steps are similar to the process steps described above in FIGS. 4B-4K except that the trench 255 extends downwardly through the P-epitaxial layer and the P+ source epitaxial layer to reach the N++ substrate.

According to above device configuration, a low manufacturing cost is achieved because a lower effective die cost can be achieved by using a small die by reducing the cell pitch with the trenched source body interconnect without lateral diffusion of the sinker connect region. This reduced cost is able to offset the higher manufacturing costs. Most importantly, a low source inductance is achieved through the use of a substrate source contact while minimizing the source resistance by implementing the source-body interconnect structure surrounded with P++ liner implant regions. Furthermore, a small pitch of the device as described above further reduces the specific-on-resistance (Rsp) for a given operating voltage. The device configuration is conveniently scalable for compatible designs and operations adaptable to devices that require a range of high and low voltages.

Therefore, the top drain LDMOS device with an inverted ground-source as disclosed allows for vertical current through vertical channel with controllable drift length of the drift region implemented with the vertical channel enable the manufactures of small and scalable cell pitch. With the source contact at the bottom of the trench in direct contact with the highly doped substrate reduces the source resistance. There is no longer a need for deep resistive sinker region or trench contact as that usually implemented in the conventional bottom source FET devices.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A top-drain lateral diffusion metal oxide field effect semiconductor (TD-LDMOS) device supported on a semiconductor substrate comprising:
    a bottom layer of a heavily dopant layer of a first conductivity type supporting a source electrode formed as a dopant layer of a second conductivity disposed on top of the bottom layer of the first conductivity type;
    a source region and a drain drift region of the first conductivity type disposed on two opposite sides of a planar gate disposed on a top surface of the semiconductor substrate with gate sidewalls covered by a gate insulation spacer laterally extending away from the planar gate wherein the source region is encompassed in a body region wherein the drain drift region constituting a drift region as a lateral current channel under the planar gate between the source region and a drain electrode disposed on a top surface of the semiconductor substrate; and
    at least a body-source interconnect trench opened into the semiconductor substrate vertically aligned with an edge of the gate insulation spacer wherein the trench is filled with a conductive material and extending vertically from the body region near the top surface of the semiconductor substrate downwardly with a conductive liner disposed below a bottom surface of the body-source interconnect trench to electrically contact the source electrode disposed on top of the bottom layer of the first conductivity type near the bottom surface of the semiconductor substrate.

2. The TD-LDMOS device of claim 1 wherein:
    the bottom layer of the heavily dopant layer of the first conductivity type is a N++ layer the supporting a P epitaxial layer for forming the source and drain regions of an N type dopant near the top surface of the semiconductor substrate.

3. The TD-LDMOS device of claim 1 wherein:
    the conductive material filling in the body-source interconnect trench comprising a selective epitaxial growth (SEG) of silicon or a SEG of silicon-germanium (SiGe).

4. The TD-LDMOS device of claim 2 wherein:
    the conductive material filling in the body-source interconnect trench comprising a heavily doped P++ selective epitaxial growth (SEG) of silicon or a SEG of silicon-germanium (SiGe).

5. The TD-LDMOS device of claim 1 wherein:
    the conductive material filling in the body-source interconnect trench comprising a metal.

6. The TD-LDMOS device of claim 1 wherein:
    the body-source interconnect trench filled with the conductive material having a top surface disposed below the top surface of the semiconductor substrate for exposing a sidewall of the source region underneath the gate insulation spacer.

7. The TD-LDMOS device of claim 1 wherein:
    the conductive material filling in the body-source interconnect trench comprising a metal of tungsten.

8. The TD-LDMOS device of claim 1 wherein:
    a conductive liner disposed below the bottom surface of the body-source interconnect trench is a metal liner for contacting the bottom layer of the heavily dopant layer of the first conductivity type for forming an ultra-low resistive local interconnect.

9. The TD-LDMOS device of claim 1 wherein:
    the conductive liner disposed below the bottom surface of the body-source interconnect trench is a salicide Ti/TiN liner.

10. The TD-LDMOS device of claim 1 wherein:
    the TD-LDMOS device is configured to have a closed cell layout.

11. The TD-LDMOS device of claim 1 wherein:
    the drain drift region further comprising a heavily doped drain contact region of the first conductivity type for contacting the drain electrode disposed on the top surface of the semiconductor substrate.

12. The TD-LDMOS device of claim 1 wherein:
    the semiconductor substrate further comprising a deep buffer layer implanted with dopant of the second conductivity type disposed at a distance above the dopant layer of the second conductivity functioning as the source electrode.

13. The TD-LDMOS device of claim 1 wherein:
    the TD-LDMOS comprises a P-channel device formed in an N+Si substrate wherein the drain drift region constituting a P-type lateral current channel under the planar gate.

14. The TD-LDMOS device of claim 1 wherein:
    the planar gate further comprises a stacked planar gate having a N-doped gate padded by a gate oxide layer underneath and covered by a gate cap oxide and further surrounded by the gate insulation spacer on sidewalls of the stacked planar gate.

15. The TD-LDMOS device of claim 14 further comprising:
    a gate shield layer comprises a metal layer covering over the gate cap oxide and side spacer layer wherein the gate shield layer further extends to a top surface above the source region and the conductive material filling the body-source interconnect trench.

\* \* \* \* \*